United States Patent
Suzuki

(10) Patent No.: US 8,648,990 B2
(45) Date of Patent: Feb. 11, 2014

(54) OPTICAL DEVICE

(75) Inventor: Naofumi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/883,890

(22) PCT Filed: Nov. 14, 2011

(86) PCT No.: PCT/JP2011/076203
§ 371 (c)(1),
(2), (4) Date: May 7, 2013

(87) PCT Pub. No.: WO2012/067075
PCT Pub. Date: May 24, 2012

(65) Prior Publication Data
US 2013/0228818 A1 Sep. 5, 2013

(30) Foreign Application Priority Data
Nov. 15, 2010 (JP) ................................. 2010-254823

(51) Int. Cl.
*G02F 1/1343* (2006.01)

(52) U.S. Cl.
USPC ................ 349/139; 349/56; 349/84; 349/140

(58) Field of Classification Search
USPC ...................... 349/56, 84, 139, 140
See application file for complete search history.

(56) References Cited

U.S. PATENT DOCUMENTS

| | | | | |
|---|---|---|---|---|
| 7,663,709 B2 * | 2/2010 | Nagasawa | ........................ | 349/39 |
| 7,879,635 B2 * | 2/2011 | Shiga et al. | ...................... | 438/31 |

FOREIGN PATENT DOCUMENTS

| | | |
|---|---|---|
| JP | 07-038151 A | 2/1995 |
| JP | 2005-197289 A | 7/2005 |
| JP | 2005-219982 A | 8/2005 |
| JP | 2006-073321 A | 3/2006 |
| JP | 2007-258277 A | 10/2007 |
| JP | 2009-260316 A | 11/2009 |
| JP | 2010-212401 A | 9/2010 |

OTHER PUBLICATIONS

J.Q. Xi, et al., "Omnidirectional reflector using nanoporous SiO2 as a low-refractive-index material", Optics Letters, vol. 30, No. 12, Jun. 15, 2005, pp. 1518-1520.
International Search Report of PCT Application No. PCT/JP2011/076203 mailed on Feb. 14, 2012.

* cited by examiner

*Primary Examiner* — Jennifer Doan
(74) *Attorney, Agent, or Firm* — Sughrue Mion, PLLC

(57) ABSTRACT

A semiconductor light emitting device includes a laminate section in which p-type layer 5 and n-type layer 7 are laminated such that they sandwich active layer 6. A part of light emitted from active layer 6 exits from a first surface of the laminate section. The semiconductor light emitting device includes a reflection layer that is located on a second surface opposite to the first surface of the laminate section and that reflects light that is emitted from active layer 6 and that enters from the second surface in the direction of the active layer side. The reflection layer includes metal layer 1 and transparent electrode films 2 to 4 that are transparent to a wave length of light that enters from active layer 6 and that have conductivity. The refractive index of transparent conduction film 3 is lower than that of each of transparent conduction films 2 and 4 and p-type layer 5. The absorption coefficient of transparent conduction film 3 is smaller than that of each of transparent conduction films 2 and 4.

13 Claims, 4 Drawing Sheets

Fig.1 PRIOR ART
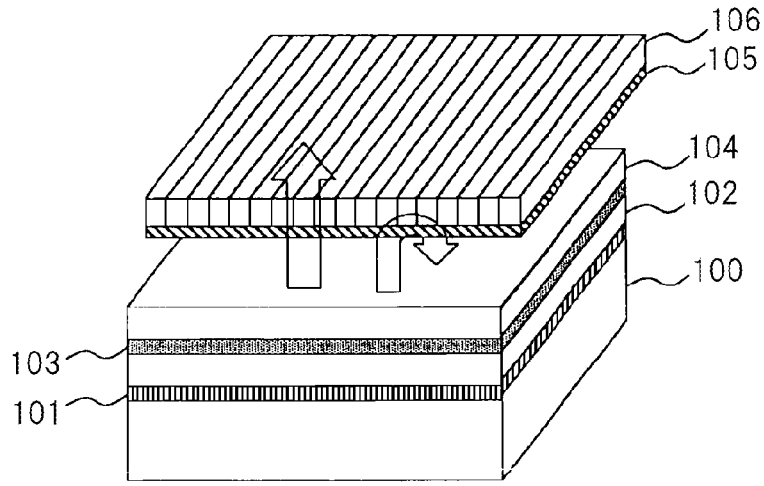
Fig.2 PRIOR ART
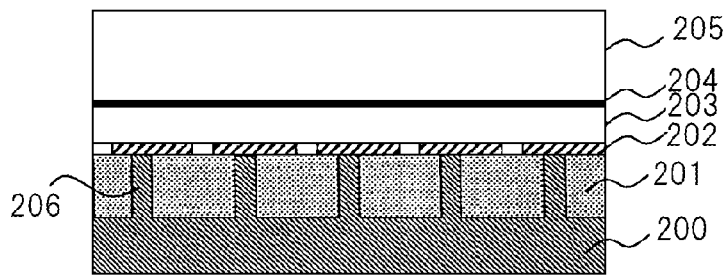
Fig.3 PRIOR ART
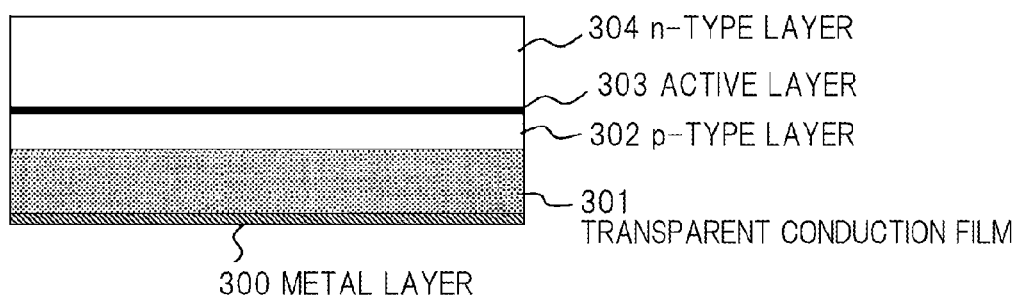
Fig.4
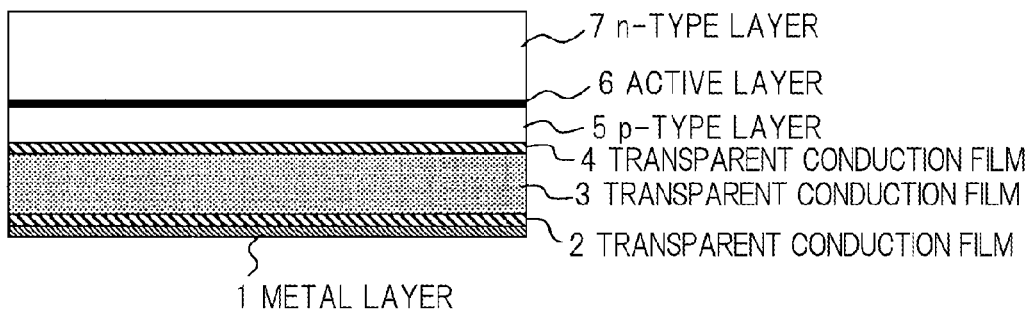

OPTICAL DEVICE

This application is a National Stage Entry of PCT/JP2011/076203 filed Nov. 14, 2011, which claims priority from Japanese Patent Application 2010-254823 filed Nov. 15, 2010, the contents of all of which are incorporated herein by reference, in their entirety.

TECHNICAL FIELD

The present invention relates to an optical device that includes a laminate section in which a p-type layer and an n-type layer are laminated such that they sandwich an active layer that functions as a light absorption layer or as a light emission layer, in particular, to a light emitting device of a surface light emitting type represented by a light emitting diode (LED) or the like and a light receiving device used for a solar battery or the like.

BACKGROUND ART

Some recent liquid crystal projectors use an LED as a light source for illuminating a liquid crystal panel.

In a liquid crystal projector, a liquid crystal panel needs to be irradiated with polarized light (specifically, S-polarized light or P-polarized light). Since light that is output from an LED is non-polarized light, if an LED is used as a light source for illuminating the liquid crystal panel, a polarization conversion is performed with regard to light that is output from the LED. Specifically, with respect to non-polarized light that is output from an LED, a polarization conversion is performed, in which one polarization component is selected from among linearly polarized light components, that are orthogonal each other, is converted to the other polarization component. If the polarization conversion efficiency is low, the light utilization efficiency will be reduced. If the polarization conversion is not performed at all, about half of the light that is output from the LED will not be used as an illumination light.

As a structure in which a polarization conversion element that comprises the first and second prisms is located opposite to the exit surface of the LED has been known as a structure in which a polarization conversion of light that is output from an LED is performed.

Each of the first prism and the second prism is a rectangular parallelepiped prism in which two rectangular prisms are adhered each other.

The first prism has a structure in which a polarized light separation film that transmits P-polarized light and reflects S-polarized light is formed on the adhesion surface of the two right-angled prisms such that light that is output from an LED enters the polarized light separation film at an incident angle of around 45 degrees. An exit surface from which P-polarized light exits is located in the propagation direction of P-polarized light that passed through the polarized light separation film.

The second prism has a structure in which a reflection film is formed on the adhesion surface of two right-angled prisms such that S-polarized light that is reflected by the polarized light separation film of the first prism enters the reflection film at an incident angle of around 45 degrees. An exit surface from which S-polarized light exits is located in the propagation direction of light that is reflected by the reflection film. A phase difference plate that converts S-polarized light into P-polarized light is located on the exit surface.

P-polarized light that exits from the first prism propagates in the same direction as P-polarized light that exits from the second prism does.

However, the structure using the foregoing polarization conversion device has the following problem.

Generally, in a projection type display device in which a display device is irradiated with light that is output from a light source and in which an image that is formed by the display device is projected through a projection lens, there is the constraint of etendue that is determined by the angle of divergence and the area of the light source. In order to effectively use the light that is output from the light source as projection light, the value of the product of the angle of divergence and the area of the light source needs to be equal to or less than the value of the product of the area of the display element and the acceptance angle (solid angle) that is determined by the f-number of the projection lens.

The area of each exit surface (first exit surface and second exit surface) of the polarization conversion device is around two times as large as the light emission area of an LED.

Thus, as the area of the exit surface increases, light that is not used for projection light increases due to the constraint of etendue. As a result, the light utilization efficiency will be reduced.

A polarized LED, in which a polarization conversion can be performed without increasing the area of the exit surface, has been proposed.

FIG. 1 shows an example of the structure of a polarized LED.

As shown in FIG. 1, the LED is composed of a laminate section in which reflection layer 101, p-type layer 102, active layer 103, and n-type layer 104 are successively laminated on sub mount 100.

Polarizer 106 is located opposite to the surface of n-type layer 104 of the LED. ¼ wavelength plate 105 is located on the LED side surface of polarizer 106 such that ¼ wavelength plate 105 faces the LED. Reflection layer 101 also functions as an electrode. The sub mount 100 side is the rear surface of the LED, whereas the n-type layer 104 side is the front surface of the LED.

Active layer 103 emits light (non-polarized light). Light that propagates from active layer 103 to the front surface side of the LED exits from the front surface of n-type layer 104. On the other hand, light that propagates from active layer 103 to the rear surface side of the LED is reflected in the direction of active layer 103 by reflection layer 101. The reflected light successively passes through p-type layer 102 and active layer 103 and then exits from the front surface of n-type layer 104.

Light that exits from the front surface of n-type layer 104 enters polarizer 106 through ¼ wavelength plate 105. With regard to light that enters polarizer 106, first polarized light (one of P-polarized light and S-polarized light) passes through polarizer 106, whereas second polarized light (the other polarized light of P-polarized light and S-polarized light) is reflected in the direction of the LED by polarizer 106.

Light reflected by polarizer 106 passes through ¼ wavelength plate 105 and then enters the front surface of n-type layer 104. With regard to light that enters the front surface of n-type layer 104, a part of the light is reflected on the front surface. Most of the light enters the LED.

Light that enters the LED successively passes through n-type layer 104, active layer 103, and p-type layer 102. Light that has passed through p-type layer 102 is reflected in the direction of active layer 103 by reflection layer 101. The reflected light successively passes through p-type layer 102 and active layer 103 and then exits from the front surface of n-type layer 104.

Second polarized light that has been reflected by polarizer 106 and that has passed through ¼ wavelength plate 105 twice in the process of which the second polarized light returns to the LED and in the process of which the second polarized light is reflected in the direction of polarizer 106 by reflection layer 101 is converted into first polarized light and then the first polarized light passes through polarizer 106.

In the foregoing polarized LED, with respect to non-polarized light that exits from the front surface of n-type layer 104, first polarized light directly passes through polarizer 106, whereas since second polarized light passes through ¼ wavelength plate 105 twice, the second polarized light is converted into the first polarized light and then it passes through polarizer 106.

Since the area of the front surface of the LED is nearly the same as that of the exit surface of polarizer 106, the polarization conversion can be carried out without increasing the area of the exit surface.

However, the material of reflection layer 101 needs to operate as an electrode of p-type layer 102 and to have high reflectance. At present, such a material has not been provided.

For example, Ag is known as a material that has high reflectance. If Ag is used as the material of reflection layer 101, reflection layer 101 that has high reflectance can be obtained. However, Ag does not satisfactorily operate as an electrode of p-type layer 102 (for example, p-GaN layer). In addition, since reflection layer 101 made of Ag does not have sufficient adhesion to p-type layer 102, it might deteriorate the reliability of the LED.

If a Ni layer or a Ti layer is formed between reflection layer 101 made of Ag and p-type layer 102, reflection layer 101 can operate as an electrode of p-type layer 102. In addition, this structure improves adhesion of reflection layer 101 to p-type layer 102. However, in this case, since the Ni layer or Ti layer absorbs light, the light extraction efficiency on the front surface of the LED will become proportionally lower.

Accordingly, a semiconductor light emitting device that improves the reflectance on the rear surface side of the LED has been proposed (refer to Patent Literature 1).

FIG. 2 schematically shows the structure of principal sections of the semiconductor light emitting device described in Patent Literature 1. In FIG. 2, the structure of the principal sections of the semiconductor light emitting device is simplified.

Referring to FIG. 2, p-type semiconductor layer 203, light emitting layer 204, and n-type semiconductor layer 205 are successively laminated. Transparent conductor layer 202, transparent layer 201, and metal layer 200 are successively laminated on the p-type semiconductor layer 203 side (rear surface) of the laminate structure.

Metal layer 200, transparent layer 201, and transparent conductor layer 202 make up the reflection film on the rear surface side of the semiconductor light emitting device.

Transparent layer 201 has a lower refractive index than p-type semiconductor layer 203 for a wavelength of light emitted from active layer 204. In addition, the film thickness of transparent layer 201 is equal to or greater than ¾ of the wavelength of light. Since transparent layer 201 is an insulation layer, a plurality of metal portions 206 that pierce transparent layer 201 are formed such that metal layer 200 conducts electricity to transparent conductor layer 202.

Metal layer 200 and metal portions 206 are made of, for example, Ag. Transparent layer 201 is made of, for example, $SiO_2$. Transparent conductor layer 202 is an electrode layer of p-type semiconductor layer 203. Transparent conductor layer 202 is made of at least one from among ITO, GZO, ZnO, and AZO. P-type semiconductor layer 203 is made of, for example, GaN.

In the foregoing semiconductor light emitting device, light that is emitted from light active layer 204 and that propagates toward the rear surface side is reflected in the direction of light active layer 204 by the reflection film. Since the refractive index of the reflection film on the rear surface side (that mainly depends on the refractive index of transparent layer 201) is lower than that of p-type semiconductor layer 203, light that enters the reflection film at an incident angle that is greater than the critical angle is totally reflected. If the thickness of transparent layer 201 is equal to or greater than ¾ of the wave length of light, the problem, in which light that leaks to transparent layer 201 and that is not totally reflected reaches metal layer 200 and then the light is absorbed by metal layer 200, can be solved. Thus, the foregoing semiconductor light emitting device can realize high reflectance.

In addition, transparent conductor layer 202 effectively functions as an electrode layer of p-type semiconductor layer 203. In addition, transparent conductor layer 202 has sufficient adhesion to p-type semiconductor layer 203.

RELATED ART LITERATURE

Patent Literature

Patent Literature 1: JP2009-260316A, Publication
Patent Literature 2: JP2005-219982A, Publication
Patent Literature 3: JP2006-073321A, Publication
Non-Patent Literature 1: J. - Q. Xi et al., "Omni-directional reflector using nano-porous $SiO_2$ as a low-refractive-index material", Optics Letters vol. 30, no. 12, pp. 1518-20 (2005)

SUMMARY OF THE INVENTION

However, the semiconductor light emitting device described in Patent Literature 1 has the following problem.

Current is injected from metal layer 200 to p-type semiconductor layer 203 through each of metal portions 206 and transparent conductor layer 202. If transparent conductor layer 202 is thin and the intervals of metal portions 206 are large to some extent, the amount of current that is injected becomes maximal in the region that neighbors metal portions 206 on the transparent conductor layer 202 side surface of p-type semiconductor layer 203. The amount of current injected decreases reversely proportional to the distance from the region. Thus, since the amount of current injected into p-type semiconductor layer 203 is uneven in the direction along the surface, it is difficult to cause active layer 204 to entirely and effectively emit light.

In addition, since such a structure needs a process that forms metal portions 206, the number of manufacturing steps proportionally increases.

If the number of metal portions 206 is increased and their density is increased, the amount of current that is injected into p-type semiconductor layer 203 can be prevented from becoming uneven. In this case, the amount of light absorbed by metal portions 206 increases as the number of metal portions 206 increases. Thus, the reflectance of the reflection film on the rear surface side becomes lower and thereby the light extraction efficiency on the front surface of the semiconductor light emitting device becomes lower.

The problem involving electric power extraction for a light receiving device takes precedence over the problem concerning the above described current injection. In other words, a light receiving device has a structure in which the reverse process of a light emitting device is performed, namely active layer 204 causes electrons to absorb light energy (light excitation) and then the electrons are extracted as electric power through metal portions 206. In a region in which metal portions 206 are absent, carriers that are generated due to light absorption propagate p-type semiconductor layer 203 in the horizontal direction and then reach metal portions 206. As a result, since voltage drop occurs, energy that can be extracted decreases. If the number of metal portions 206 is increased and thereby their density is increased, the propagation distance in the horizontal direction can be shortened and voltage drop can be decreased. However, the reflectance adversely decreases likewise in the light emitting device.

The foregoing problem in which the reflectance of the reflection film becomes lower as adhesion of metal portions 206 increases with an addition of Ni or Ti occurs likewise in a light receiving device. When the reflectance of a light receiving device becomes lower, the light absorption efficiency of the active layer will become lower.

The foregoing problem of which the number of manufacturing steps increases also occurs likewise in a light receiving device.

An object of the present invention is to provide an optical device that solves the foregoing problems and that increases reflectance of the reflection layer on the rear surface side and improves the light extraction efficiency or light absorptivity.

To achieve the above object, an optical device according to an exemplary aspect of the present invention is an optical device including a laminate section in which a first conduction-type layer and a second conduction-type layer are laminated such that they sandwich an active layer, said optical device comprising:

a reflection layer that is located on a first surface on said second conduction-type layer side of said laminate section and that reflects light that is emitted from said active layer or light that enters from a second surface opposite to said first surface of said laminate section and passes, through said active layer, toward said laminate section, wherein said reflection layer includes:
a metal layer; and
a transparent electrode layer located between said metal layer and said first surface of said laminate section, wherein said transparent electrode layer includes first and second transparent conduction films that is transparent to a wave length of light that enters from said active layer and that have conductivity, wherein said first and second transparent conduction films are laminated in this order on said first surface of said laminate section, wherein the refractive index of said second transparent conduction film is lower than that of each of said first transparent conduction film and said second conduction-type layer, and wherein the absorption coefficient of said second transparent conduction film is smaller than that of said first transparent conduction film.

BRIEF DESCRIPTION OF DRAWINGS

[FIG. 1] is a schematic diagram showing an example of a polarized LED.

[FIG. 2] is a sectional view showing the structure of principal sections of a semiconductor light emitting device described in Patent Literature 1.

[FIG. 3] is a sectional view showing the structure of a semiconductor light emitting device including a reflection layer composed of a metal layer and a transparent conduction film.

[FIG. 4] is a sectional view showing principal sections of a semiconductor light emitting device according to a first exemplary embodiment of the present invention.

DESCRIPTION OF REFERENCE NUMERALS

Figure 5:
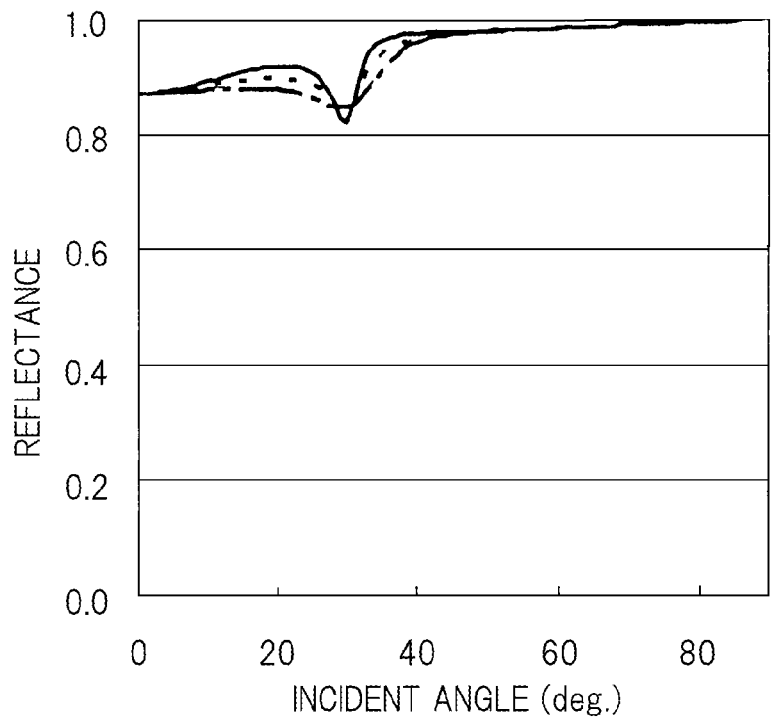
[FIG. 5] is a characteristic diagram showing the relationship between the reflectance and the incident angle of a reflection layer of the semiconductor light emitting device shown in FIG. 4.

1 Metal layer
2 to 4 Transparent conduction film
5 P-type layer
6 Active layer
7 N-type layer Exemplary Embodiment Next, with reference to the accompanying drawings, an exemplary embodiment of the present invention will be described.

The inventor of the present patent application focused on the fact that if a reflection layer formed on the rear surface side of a semiconductor light emitting device is composed of a metal layer and a transparent conduction film, the foregoing problems in which the amount of injection current becomes uneven and the number of manufacturing steps increases can be solved. The inventor analyzed the structure of the reflection layer and obtained the following knowledge described below.

FIG. 3 shows the structure of a semiconductor light emitting device including a reflection layer composed of a metal layer and a transparent conduction film.

Referring to FIG. 3, the semiconductor light emitting device includes a laminate section in which p-type layer 302 and n-type layer 304 are laminated such that they sandwich active layer 303. In addition, transparent conduction film 301 and metal layer 300 are successively laminated on the p-type layer 302 side surface of the laminate section. Transparent conduction film 301 and metal layer 300 form the reflection layer.

Transparent conduction film 301 is made of ITO, GZO, or the like. The refractive index of transparent conduction film 301 is, for example, 2.1. The absorption coefficient of transparent conduction film 301 is, for example, 5000 $cm^{-1}$. The film thickness of transparent conduction film 301 is, for example, 3×(λ/4 n) where λ is the wavelength of light emitted from active layer 303 and n is the refractive index of transparent conduction film 301.

P-type layer 302 is made of, for example, p-GaN and has an refractive index of 2.5 for light having a wavelength of 450 nm. Current is injected from metal layer 300 into p-type layer 302 through transparent conduction film 301.

In the semiconductor light emitting device shown in FIG. 3, since current is entirely and evenly injected into p-type layer 302, characteristic degradation due to uneven injection of current does not occur. In addition, since it is not necessary to form a plurality of metal portions, the number of manufacturing steps can proportionally decrease. Thus, this semiconductor light emitting device can solve the problems involved in the semiconductor device described in Patent Literature 1.

However, the semiconductor light emitting device shown in FIG. 3 has the following problem.

In the semiconductor light emitting device shown in FIG. 3, the refractive index of transparent conduction film 301 is 2.1, whereas the refractive index of p-type layer 302 is 2.5. Thus, their difference is small. As a result, the critical angle at which total reflection occurs becomes large. Light at an incident angle that is smaller than the critical angle reaches metal layer 300. Metal layer 300 absorbs the light. Thus, the entire reflectance becomes low.

On the other hand, since the absorption coefficient of transparent conduction film 301 is as large as 5000 $cm^{-1}$, transparent conduction film 301 largely attenuates light, resulting in lowering the reflectance.

As a technique that increases the reflectance of the reflection layer, transparent conduction film 301 may be made of a material having a low refractive index. An example of a material having a low refractive index is $GZO+CaF_2$ described in Patent Literature 2. The refractive index of $GZO+CaF_2$ is around 1.52.

If a transparent conduction film made of $GZO+CaF_2$ is used, since the critical angle at which the total reflection occurs can be decreased, the amount of light that reaches metal layer 300 can be decreased. As a result, the reflectance can be improved. In addition, since the number of carriers that occur in the transparent conduction film is smaller than the number of carriers that occur in ITO or GZO, the absorption coefficient of the transparent conduction film is small. Thus, since the transparent conduction film prevents absorption of light, the reflectance of the transparent conduction film increases.

However, if a material having a low refractive index, for example ($GZO+CaF_2$), is used for transparent conduction film 301, another problem will occur. As described above, since the number of carriers that occur in a material having a low refractive index is small, the contact resistance between transparent conduction film 301 and p-type layer 302 and the contact resistance between transparent conduction film 301 and metal layer 300 will become large.

Generally, since the absorption coefficient is proportional to the number of carriers that occur in the transparent conduction film, the reflectance can be increased by preventing the absorption of light. However, a problem in which the contact resistance is reversely proportional to the number of carriers will occur.

As described in Patent Literature 2, the conductivity, namely the number of carriers, of the transparent conduction film is proportional to its refractive index. Thus, if a transparent conduction film having a low refractive index is used to decrease the critical angle and increase the reflectance, since the number of carriers decreases, the light absorption decreases. Thus, although the objective in which a high reflectance is obtained can be achieved, the problem in which the contact resistance becomes large will occur.

As described above, since there is a tradeoff between the reflectance and the contact resistance of the reflection layer, using the structure shown in FIG. 3 makes it difficult to form a layer that has high reflectance and low contact resistance.

To obtain a semiconductor light emitting device having high light extraction efficiency, it is necessary not only to solve the problem in which the amount of injection current becomes uneven and the problem in which the number of manufacturing steps increases, but also to form a reflection layer having high reflectance taking into consideration the above tradeoff that is newly obtained from the result that is analyzed by the inventor.

Next, with reference to the accompanying drawings, exemplary embodiments of the present invention will be described.
(First Exemplary Embodiment)

FIG. 4 is a sectional view showing principal sections of a semiconductor light emitting device according to a first exemplary embodiment of the present invention.

Referring to FIG. 4, the semiconductor light emitting device is a solid state light source of the surface light emitting type (for example, an LED of surface light emitting type). The semiconductor light emitting device includes a laminate section in which p-type layer 5 and n-type layer 7 are laminated such that they sandwich active layer 6. A reflection layer composed of metal layer 1 and transparent conduction films 2 to 4 is laminated successively on the p-type layer 5 side surface of the laminate section.

Metal layer 1 is made of a metal material having high reflectance, for example Ag. P-type layer 5 and n-type layer 7 are each made of a semiconductor material having a high refractive index, for example GaN.

Transparent conduction films 2 to 4 each have light transmissibility for a wavelength of light emitted from active layer 6 and each film is conductive. The reflection layer composed of transparent conduction films 2 to 4 and metal layer 1 functions as a p-type electrode of p-type layer 5.

Each of transparent conduction films 2 and 4 is a transparent conduction film having a high refractive index. The material of each of transparent conduction films 2 and 4 may be ITO, GZO, ZnO, AZO, or the like. If each of transparent conduction films 2 and 4 is made of ITO, its refractive index is around 2.1 and its absorption coefficient is around 5000 $cm^{-3}$. The film thickness of each of transparent conduction films 2 and 4 is, for example, 10 nm. The film thickness of transparent conduction film 2 may be different from that of transparent conduction film 4.

Transparent conduction film 3 is a transparent conduction film having a low absorption coefficient and a low refractive index. For example, transparent conduction film 3 may be formed as a dielectric mixture film, a porous film, a film made of a composite conduction material using transparent conductor particles as a filler, a conductive polymer film, or the like.

The dielectric mixture film is, for example, a mixture of GZO in which Ga is doped to ZnO and a material having a low refractive index such as $CaF_2$, $SmF_2$, $ZnO_2$, $YF_3$, $ZrO_2$, $SrTiO_3$, $BaTiO_3$, or the like. For example, if transparent conduction film 3 is made of ($GZO+CaF_2$), the refractive index of transparent conduction film 3 is 1.52 and its absorption coefficient is 50 $cm^{-3}$. Alternatively, the dielectric mixture film may be made of a mixture of ITO and a dielectric material.

A porous film is, for example, a porous ITO film as described in Patent Literature 3. A porous ITO film is formed by applying a mixture of ITO film forming organic solution containing indium, tin, and alcohol and at least one type of non-ionic surfactant to a substrate and performing heat treatment for the substrate at a predetermined temperature. If transparent conduction film 3 is made of a porous ITO film, the refractive index of transparent conduction film 3 is around 1.74.

The film thickness of transparent conduction film 3 is, for example, 2.85×(λ/4 n) where λ is the wavelength of light emitted from active layer 6 and n is the refractive index of transparent conduction film 3.

The film thickness of transparent conduction film 3 is set up to be greater than that of each of transparent conduction films 2 and 4.

An n-type electrode of n-type layer 7 is not shown in FIG. 4 for convenience's sake. The n-type electrode is formed on the surface opposite to the active layer 6 side of n-type layer 7. The n-type electrode may be formed in a comb pattern. The n-type electrode may be made of a material that is used for a transparent electrode such as ITO.

In the semiconductor light emitting device according to this embodiment, current is injected into p-type layer 5 through metal layer 1 and conduction films 2 to 4 and thereby active layer 6 emits light.

Light that is emitted from active layer 6 and that propagates toward n-type layer 7 exits from the surface opposite to the active layer 6 side of n-type layer 7, namely the uppermost surface shown in FIG. 4.

In contrast, light that is emitted from active layer 6 and that propagates toward p-type layer 5 is reflected by the reflection layer composed of metal layer 1 and conduction films 2 to 4. Next, the reflectance of the reflection layer will be considered. In the reflection layer, reflections occur on a first interface between p-type layer 5 and transparent conduction film 4, a second interface between transparent conduction film 3 and transparent conduction film 4, a third interface between transparent conduction film 2 and transparent conduction film 3, and the transparent conduction film 2 side surface of metal layer 1.

If the refractive index of p-type layer 5, the refractive index of each of transparent conduction film 2 and 4, and the refractive index of transparent conduction film 3 are 2.5, 2.1, and 1.52, respectively, light at an incident angle that is equal to or greater than around 57 degrees of light that enters from the p-type layer 5 side at incident angels of 0 to 90 degrees is totally reflected on the first interface. On the other hand, light having incident angles equal to or greater than around 37 degrees is totally reflected on the second interface. Since transparent conduction film 3 having a low refractive index increases the ratio of light that is totally reflected, the entire reflectance will improve.

Although the absorption coefficient of each of transparent conduction films 2 and 4 is as large as, for example, 5000 $cm^{-3}$, their film thickness is small. Thus, the amount of light absorbed by these films is small. In contrast, although the film thickness of transparent conduction film 3 is relatively large, since its absorption coefficient is as low as 50 $cm^{-3}$, the amount of light absorbed by this film is also small.

Thus, the foregoing reflection layer totally reflects most of the light such that light does not reach metal layer 1. In addition, since light absorption of transparent conduction films 2 to 4 is prevented, the foregoing reflection layer can realize a high reflectance.

FIG. 5 shows the relationship between the reflectance and the incident angle of the reflection layer of the semiconductor light emitting device according to this embodiment. The vertical axis represents reflectance, whereas the horizontal axis represents the incident angle of light that enters from the p-type layer 5 side to the reflection layer. The wavelength of incident light is 450 nm.

In FIG. 5, a curve denoted by a solid line represents the reflectance of S-polarized light, a curve denoted by a dashed line represents the reflectance of P-polarized light, and a curve denoted by a broken line represents the average of both.

As described above, when the incident angle is equal to or greater than around 37 degrees, since light is totally reflected on the reflection layer, a very high reflectance is obtained.

As shown in FIG. 5, the reflectance has a polarized light dependency and an incident angle dependency. As an index that represents the performance of a reflection mirror, a weighted average reflectance given by the following formula is often used.

$$\text{Rave} = \int_0^{\pi/2} R(\theta)\sin\theta d\theta \qquad (1)$$

where θ is the incident angle and R(θ) is the reflectance at the incident angle θ. R(θ) is the average value of the reflectance of S-polarized light and the reflectance of P-polarized light. It can be said that formula (1) represents a three-dimensional average or an average in consideration of the status density of light at angle θ. Formula (1) is obtained from the fact that the solid angle at small angle θ is sinθdθ. This weighted average reflectance is used in, for example, Patent Literature 1 and Non-Patent Literature 1.

When Rave is calculated for the structure shown in FIG. 3 using formula (1), Rave becomes 0.836.

In contrast, when Rave is calculated for the structure shown in FIG. 4, namely for the reflection characteristic shown in FIG. 5, Rave becomes 0.969. Thus, it is clear that the reflectance of the structure shown in FIG. 4 is as high as around 97%. This value is higher than 0.934, which is Rave in which Ag is directly laminated on p-type layer 5. As a result, the effect in which light is totally reflected and thereby absorption of light by a metal is prevented is obtained.

Figure 6:
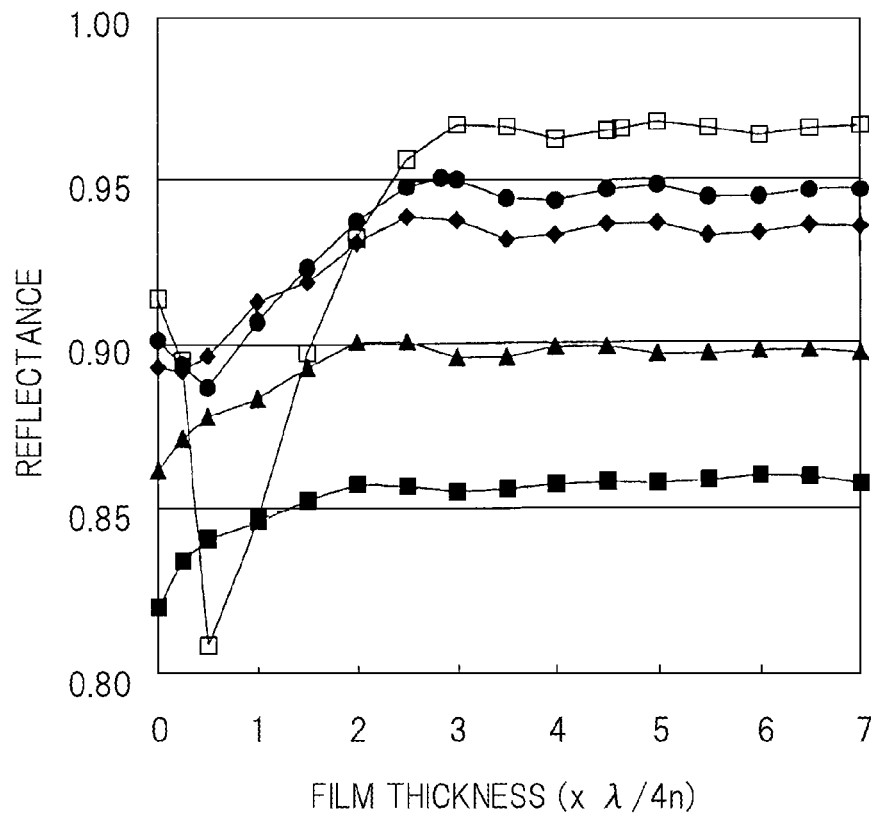
[FIG. 6] is a characteristic diagram showing the relationship between the film thickness and the reflectance of a transparent conduction film of the semiconductor light emitting device shown in FIG. 4.

FIG. 6 shows the relationship between the film thickness and the reflectance of each of transparent conduction films. In this case, the reflectance is a weighted average reflectance calculated using formula (1). FIG. 6 shows the relationship between the reflectance and the film thickness of transparent conduction film 3 in the case in which transparent conduction films 2 and 4 are removed and in which the film thickness of each of transparent conduction films 2 and 4 is 10 nm, 15 nm, 30 nm, and 50 nm. The horizontal axis represents the film thickness of transparent conduction film 3 (×θ/4 n). A graph denoted by white squares shows that transparent conduction film 4 is removed. A graph denoted by black circles shows that the film thickness of transparent conduction film 4 is 10 nm. A graph denoted by black rhombuses shows that the film thickness of transparent conduction film 4 is 15 nm. A graph denoted by black triangles shows that the film thickness of transparent conduction film 4 is 30 nm. A graph denoted by black squares shows that the film thickness of transparent conduction film 4 is 50 nm.

If the film thickness of transparent conduction film 4 is 10 nm (the graph denoted by black circles) and if the film thickness of transparent conduction film 3 is less than 2.5×(λ/4 n), the reflectance decreases in proportion to the film thickness of transparent conduction film 3. If the film thickness of transparent conduction film 3 is equal to or greater than 2.5×(λ/4 n), the reflectance is around 96% to 97%.

If the film thickness of transparent conduction film 4 is 15 nm (the graph denoted by black rhombuses) and if the film thickness of transparent conduction film 3 is less than 2.5× (λ/4 n), the reflectance decreases in proportion to the film thickness of transparent conduction film 3. If the film thickness of transparent conduction film 3 is equal to or greater than 2.5×(λ/4 n), the reflectance is around 95% to 96%.

If the film thickness of transparent conduction film 4 is 30 nm (the graph denoted by black triangles) and if the film thickness of transparent conduction film 4 is 50 nm (the graph denoted by black squares), the reflectance is less than 95%.

The result shown in FIG. 6 reveals that the film thickness of transparent conduction film 4 is preferably 15 nm or less, more preferably, 10 nm or less, and that the film thickness of transparent conduction film 4 is preferably 2.5 λ/4 n or greater, namely the length of the optical path corresponding to the film thickness of transparent conduction film 3 is preferably 0.625 or more with respect to the center wavelength of light emitted from active layer 6.

Next, the electric resistance of the region from metal layer 1 to p-type layer 5 will be considered.

Since the parts of the transparent electrode layer, which make contact with p-type layer 5 and metal layer 1, are made of transparent conduction films 4 and 2 in which many carriers occur, respectively, the contact resistance of the transparent electrode layer and p-type layer 5 can be sufficiently decreased and thereby ohmic contact can be satisfactorily achieved.

On the other hand, since the number of carriers that occurs in transparent conduction film 3 is small, the resistance of transparent conduction film 3 is large. This resistance is a bulk resistance rather than a contact resistance. If current flows on the interface because of the tunnel effect and the depletion layer on the transparent conduction film side is dominant, the contact resistance is proportional to $\exp(N^{1/2})$ where N is the spatial charge density (equal to carrier density). In contrast, the bulk resistance is proportional to $1/N$. Thus, it is clear that the carrier dependence of the bulk resistance is lower than that of the contact resistance. In other words, even if the number of carriers is decreased, the bulk resistance does not remarkably increase compared with the contact resistance. For example, now consider the resistance of transparent conduction film 3 for an electrode having an area of 1 mm square. Assuming that the film thickness of transparent conduction film 3 is 2.5×λ/4 n for light having a wavelength of 450 nm where n=1.52, the film thickness of transparent conduction film 3 becomes 185 nm. The absorption coefficient of transparent conduction film 3 is as small as 1/100 of that of ITO. In addition, since transparent conduction film 3 absorbs light mainly on the free carrier basis, the number of carriers of transparent conduction film 3 would be as small as 1/100 of that of ITO. In addition, since transparent conduction film 3 contains $CaF_2$ that causes the refractive index to become lower, the migration of carriers in transparent conduction film 3 is as low as 1/10 of that of ITO. Thus, the conductivity of transparent conduction film 3 is as low as $10^{-3}$ of that of ITO. In other words, the resistivity of transparent conduction film 3 is as high as 10 times that of ITO. Even if the resistivity of transparent conduction film 3 is 0.2 Ω·cm that is as high as around $10^3$ times that of ITO or GZO, the resistance of transparent conduction film 3 is as low as 0.00037Ω. Even if the resistivity is increased 10 times, the resistance of transparent conduction film 3 is still as low as 0.0037Ω. Thus, even if transparent conduction film 3 is made of a film in which a small number of carriers occurs, the bulk resistance can be satisfactorily prevented.

Thus, the structure shown in FIG. 4 allows both contact resistance and bulk resistance to be low.

As described above, since the semiconductor light emitting device according to this embodiment includes a reflection layer with a high reflectance, the device can have a high light extraction efficiency.

In addition, the electric resistance of the semiconductor light emitting device can be satisfactorily decreased. Moreover, current is entirely and evenly injected from metal layer 1 to the transparent electrode side surface of p-type layer 5 through the transparent electrode layer composed of transparent conduction films 2 to 4. Thus, the problem in which the amount of current injected into p-type layer 5 becomes uneven does not occur.

Moreover, it is not necessary to form a plurality of metal portions 205 unlike the semiconductor light emitting device described in Patent Literature 1. Thus, the number of manufacturing steps of the semiconductor light emitting device according to this embodiment can be decreased compared with that described in Patent Literature 1.

In addition, since a transparent conduction film has satisfactory adhesion to a p-type semiconductor and to metals, the semiconductor light emitting device according to this embodiment is preferable from a point of view of reliability compared with a structure in which a metal having a high reflectance such as Ag is directly laminated on a semiconductor.

The semiconductor light emitting device according to this embodiment can be manufactured by a manufacturing process using the known epitaxial growth technique. Next, the manufacturing procedures will be briefly described.

First, n-type layer 7, active layer 6, and p-type layer 5 are successively laminated on a first substrate on which they are grown using the epitaxial growth technique. Thereafter, transparent conduction film 4, transparent conduction film 3, transparent conduction film 2, and metal layer 1 are successively formed on the surface of active layer 6 using for example the spattering technique. Finally, the metal layer 1 side of the first substrate is mounted on a second substrate and then the first substrate is removed. As a result, the semiconductor light emitting device shown in FIG. 4 can be obtained.

(Second Exemplary Embodiment)

Figure 7:
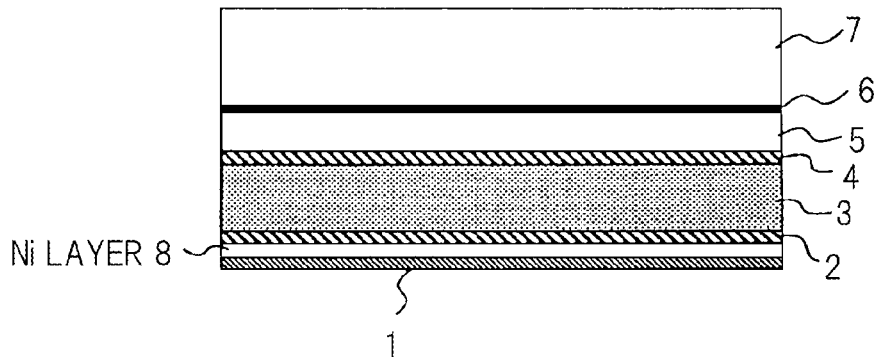
[FIG. 7] is a sectional view showing the principal sections of a semiconductor light emitting device according to a second exemplary embodiment of the present invention.

FIG. 7 is a sectional view showing the principal sections of a semiconductor light emitting device according to a second exemplary embodiment of the present invention.

The semiconductor light emitting device according to this embodiment is different from the semiconductor light emitting device according to the first exemplary embodiment in that Ni layer 8 is located between metal layer 1 and transparent conduction film 2. The film thickness of Ni layer 8 is, for example, 5 nm.

Figure 8:
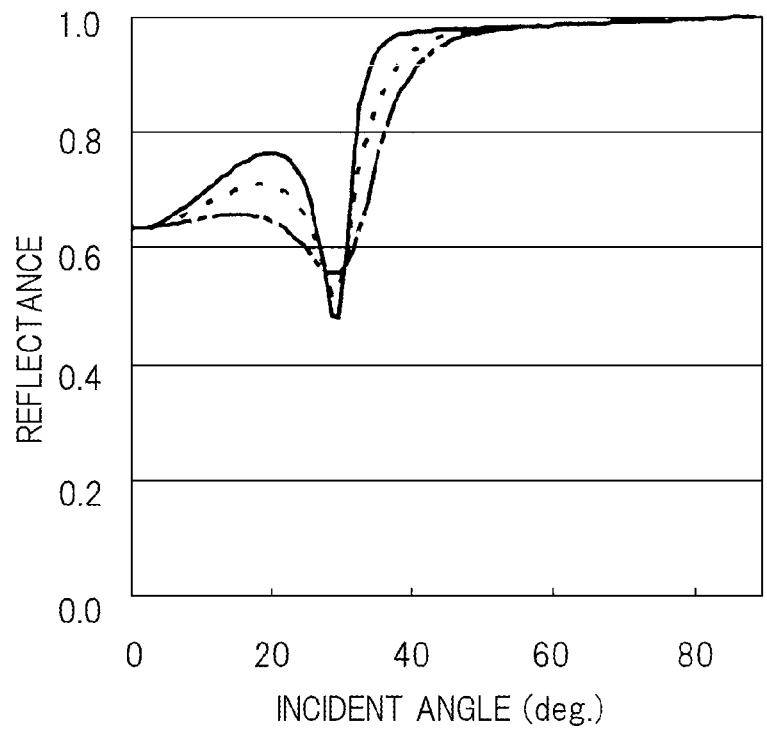
[FIG. 8] is a characteristic diagram showing the relationship between the reflectance and the incident angle of a reflection layer of the semiconductor light emitting device shown in FIG. 7.

FIG. 8 shows the relationship between the incident angle and the reflectance of a reflection layer of the semiconductor light emitting device according to this embodiment. The vertical axis shows the reflectance that is normalized to 1. The horizontal axis represents the incident angle to the reflection layer. The reflectance includes the reflectance of each of first to third interfaces and metal layer 1.

The meanings of the solid line, broken line, and dashed line shown in FIG. 8 are the same as those shown in FIG. 5.

In the semiconductor light emitting device according to this embodiment, most of light having incident angles that are around 37 degrees or greater is totally reflected on the second interface between transparent conduction film 3 and transparent conduction film 4. In this case, the reflectance of the semiconductor light emitting device according to the second exemplary embodiment is nearly the same as that of the first exemplary embodiment.

In contrast, light having incident angles that are less than 37 degrees enters metal layer 1 through Ni layer 8. Thereafter, metal layer 1 reflects the incident light in the direction of active layer 6. In this case, since Ni layer 8 absorbs light, the reflectance of the semiconductor light emitting device according to the second exemplary embodiment is lower than that of the first exemplary embodiment. In this structure, Rave calculated using formula (1) becomes 0.923.

The reflectance of light at a low incident angle of the semiconductor light emitting device according to the second exemplary embodiment is lower than that of the first exemplary embodiment. However, the reflectance of light at a high incident angle of the former is the same as that of the latter. Thus, the reflectance of light at an incident angle up to 90 degrees of the semiconductor light emitting device according to the second exemplary embodiment is relatively high.

In addition, since Ni layer 8 is located between the transparent electrode layer composed of transparent conduction films 2 to 4 and metal layer 1, the contact resistance between the transparent electrode layer and metal layer 1 of the semiconductor light emitting device according to the second exemplary embodiment can be decreased compared with that of the semiconductor light emitting device according to the first exemplary embodiment. As a result, the semiconductor light emitting device according to the second exemplary embodiment has satisfactory ohmic contact. In addition, adhesion of the transparent electrode layer to metal layer 1 can be higher than that of the first exemplary embodiment.

Figure 9:
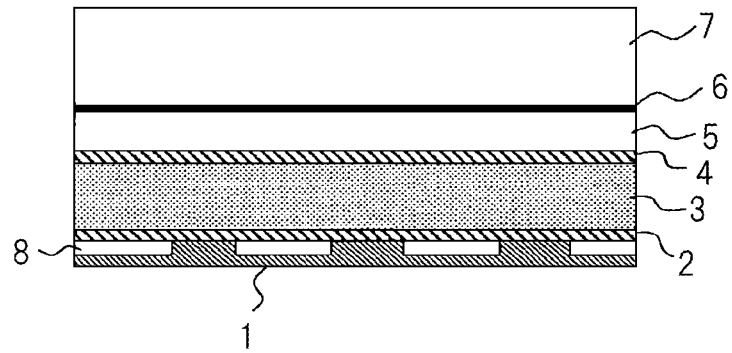
[FIG. 9] is a sectional view showing an example of an Ni layer of the semiconductor light emitting device shown in FIG. 7.

In the semiconductor light emitting device according to the second exemplary embodiment, Ni layer 8 is formed on the entire surface of metal layer 1, but the device is not limited such a structure. Alternatively, as shown in FIG. 9, Ni layer 8 may be formed by a plurality of island shaped Ni regions formed on the transparent conduction film 2 side surface of metal layer 1. Alternatively, the island shaped Ni regions may be formed in a square shape. Alternatively, the island shaped Ni regions may be formed in a matrix shape. Alternatively, the island shaped Ni regions may be one-dimensionally formed.

Any one of a Ti layer, a Cr layer, and a Pd layer may be formed instead of Ni layer 8. In this case, the semiconductor light emitting device according to the second exemplary embodiment has the same effect as the structure that has Ni layer 8.

Figure 10:
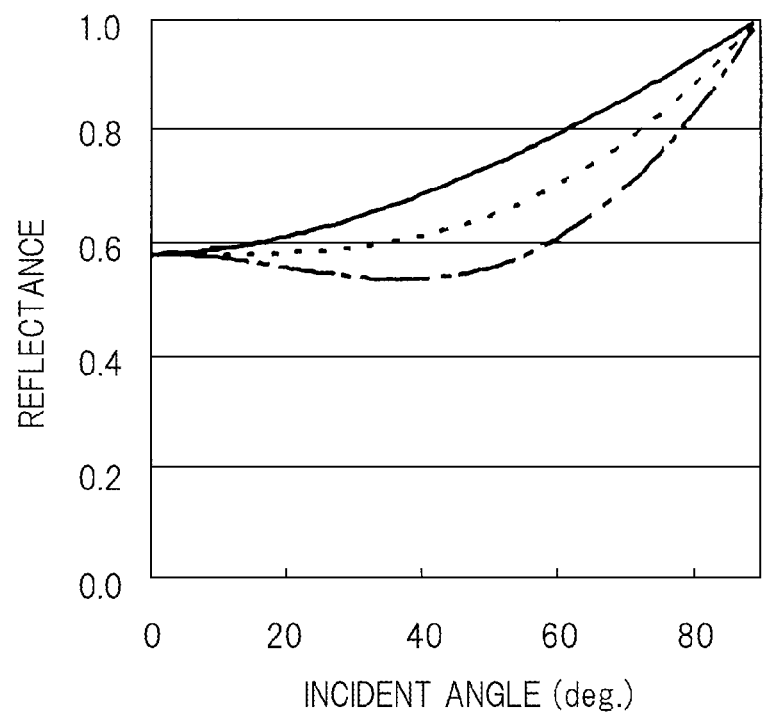
[FIG. 10] is a characteristic diagram showing the relationship between the incident angle and the reflectance of a reflection layer composed of a metal layer and an Ni layer of a semiconductor light emitting device as a comparative example that has only the Ni layer located between the metal layer and the p-type layer.

FIG. 10 shows, as a comparative example, the relationship between the incident angle and the reflectance of a reflection layer composed of a metal layer and an Ni layer of a semiconductor light emitting device that has only the Ni layer located between the metal layer and the p-type layer. The vertical axis represents the reflectance. The horizontal axis represents the incident angle to the reflection layer.

The meanings of the solid line, broken line, and dashed line shown in FIG. 10 are the same as those shown in FIG. 8.

As is clear from FIG. 10, since this structure cannot use total reflection, the reflectance of light at a high incident angle is low compared with the structure shown in FIG. 8. Thus, Rave calculated using formula (1) is as low as 0.725.

In contrast, the semiconductor light emitting device according to the second exemplary embodiment has a high reflectance of light at a high incident angle. Thus, as described above, Rave also becomes high.

The semiconductor light emitting device according to the second exemplary embodiment can be manufactured according to procedures using the foregoing epitaxial growth technique. However, in the semiconductor light emitting device according to this embodiment, after transparent conduction film 2 is formed, a step in which Ni layer 8 is formed on transparent conduction film 2 needs to be added.

With reference to the embodiments, the present invention has been described. However, the present invention is not limited to the structures of the embodiments. It should be understood by those skilled in the art that the structure and details of the present invention may be changed in various manners without departing from the scope of the present invention.

For example, the semiconductor light emitting device according to the first or second exemplary embodiment may include ¼ wavelength plate 105 and polarizer 106 shown in FIG. 1. In this case, polarizer 106 is located to face the surface opposite to the active layer 6 side of n-type layer 7. ¼ wavelength plate 105 is located between polarizer 106 and n-type layer 7.

In the foregoing structure, with respect to light that exits from the surface opposite to the active layer 6 side of n-type layer 7 and that enters polarizer 106 through ¼ wavelength plate 105, first polarized light passes through polarizer 106. On the other hand, second polarized light is reflected in the direction of active layer 6 by polarizer 106.

Light that is reflected by polarizer 106 passes through ¼ wavelength plate 105 and then enters n-type layer 7. Part of light that enters n-type layer 7 is reflected on the front surface. However, most of light enters the reflection layer (transparent conduction films 2 to 4 and metal layer 1) through active layer 6 and p-type layer 5. The reflection layer reflects the incident light in the direction of active layer 6. The reflected light passes through p-type layer 5 and active layer 6 and then exits from the front surface of the n-type layer.

Second polarized light that has been reflected by polarizer 106 and that has passed through ¼ wavelength plate 105 twice in the process in which the second polarized light propagates toward the reflection layer and in the process in which the second polarized light is reflected in the direction of polarizer 106 by reflection layer is converted into first polarized light and then the first polarized light passes through polarizer 106.

The foregoing polarization conversion improves the light utilization efficiency. Since polarized light that is arranged to first polarized light exits from polarizer 106, the semiconductor light emitting device according to the present invention can be used for a light source of an illumination device that illuminates a liquid crystal panel.

If polarization almost is canceled (which is converted to random polarization) by reflections (including multiple reflections) in the LED section, i.e., the laminate section composed of metal layer 1 to n-type layer 7, the ¼ wavelength plate may be removed.

Since the semiconductor light emitting device according to the present invention can convert non-polarized light into polarized light without an increase of the area of the light exit surface, if the semiconductor light emitting device is used for a light source of a liquid crystal projector, light loss due to the constraint of etendue can be prevented.

In the semiconductor light emitting device according to the first or second exemplary embodiment, p-type layer 5 and n-type layer 7 may be located such that they are substituted for each other. In this case, the reflection layer (composed of metal layer 1 and transparent conduction films 2 to 4) are formed on the surface opposite to the active layer 6 side of n-type layer 7. The reflection layer functions as an electrode of n-type layer 7.

In addition, the semiconductor light emitting device according to the present invention can be used for a light source of a projector. The principal sections of the projector include a semiconductor light emitting device according to the present invention, a display device that spatially modulates light that is output from the semiconductor light emitting device, and a projection optical system that projects image light generated by the display device.

The foregoing description focuses on a light source of a projector and the advantage of the structure in which the light source is combined with a polarizer. Alternatively, the present invention effectively improves the light extraction efficiency of an ordinary LED used for illumination. In other words, the semiconductor light emitting device according to the present invention can be applied to a general solid state light source of surface light emitting type represented by an LED.

In addition, the present invention can be also applied to a light receiving device that is used for a solar battery and so forth. The light receiving device according to the present invention includes a structure in which the active layer of the first and second exemplary embodiments is replaced with a light absorption layer.

A light receiving device causes electrons to absorb energy of light in a process that is the reverse of the process that the light emitting diode performs (causes light to excite electrons). The light receiving device extracts the electrons as electric power using the characteristic of the semiconductor.

In the foregoing light receiving device, a metal layer is formed on a p-type layer through a transparent electrode layer without a plurality of metal portions located between the metal layer and the second conduction-type layer unlike the structure described in Patent Literature 1. Thus, the foregoing problem about power extraction does not occur.

In addition, since the reflectance of the reflection layer can be increased, the light absorption efficiency of the active layer can be increased.

In the foregoing example, as a best mode of the present invention, transparent conduction films in which many carriers occur and that have a high refractive index are located respectively on a semiconductor layer and a metal layer. However, the contact resistance between the metal and the transparent conduction film is satisfactory compared with the contact resistance between a semiconductor layer and a transparent conduction film. Thus, if necessary, a film in which many carriers occur and that has a high refractive index can be formed only on the semiconductor side. This structure corresponds to the case in which transparent conduction film 2 is omitted from the structure shown in FIG. 4 or FIG. 7.

In the foregoing example, a device composed of semiconductors was described. Alternatively, the present invention can be applied to a light emitting device or a light receiving device made of non-semiconductor material for example an organic material.

As described above, according to the present invention, since the reflectance of the reflection layer can be increased, the light extraction efficiency or light absorptivity can be improved.

In addition, a metal layer is located on a second conduction-type layer through a transparent electrode layer without a plurality of metal portions located between the metal layer and the second conduction-type layer unlike the structure described in Patent Literature 1. Thus, problems about current injection and power extraction do not occur.

In addition, since it is not necessary to form a plurality of metal portions unlike the structure described in Patent Literature 1, the number of manufacturing steps can be decreased compared with the structure described in Patent Literature 1.

Since the portion of the transparent electrode layer that comes into contact with the second conduction-type layer is made of a transparent conduction film (first transparent conduction film) in which many carriers occur, the contact resistance between the transparent electrode layer and the second conduction-type layer can be satisfactorily decreased. In addition, adhesion of the transparent electrode layer to the second conduction-type layer can be satisfactorily increased.

The present application claims a priority based on Japanese Patent Application JP 2010-254823 filed on Nov. 15, 2010, the entire contents of which being incorporated herein by reference in its entirety.

What is claimed is:

1. An optical device including a laminate section in which a first conduction-type layer and a second conduction-type layer are laminated such that they sandwich an active layer, said optical device comprising:
   a reflection layer that is located on a first surface on said second conduction-type layer side of said laminate section and that reflects light that is emitted from said active layer or light that enters from a second surface opposite to said first surface of said laminate section and passes, through said active layer, toward said laminate section,
   wherein said reflection layer includes:
   a metal layer; and
   a transparent electrode layer located between said metal layer and said first surface of said laminate section,
   wherein said transparent electrode layer includes first and second transparent conduction films that is transparent to a wave length of light that enters from said active layer and that have conductivity,
   wherein said first and second transparent conduction films are laminated in this order on said first surface of said laminate section,
   wherein the refractive index of said second transparent conduction film is lower than that of each of said first transparent conduction film and said second conduction-type layer, and
   wherein the absorption coefficient of said second transparent conduction film is smaller than that of said first transparent conduction film.

2. The optical device as set forth in claim 1, wherein said active layer emits light and said second surface of said laminate section exits a part of light emitted from said active layer.

3. The optical device as set forth in claim 1, wherein said active layer absorbs part of light that enters from said second surface of said laminate section.

4. The optical device as set forth in claim 1, wherein said transparent electrode layer further includes:
   a third transparent conduction film that is transparent to a wave length of light that enters from said active layer and that has conductivity,
   wherein said first, second, and third transparent conduction films are laminated in this order on said first surface of said laminate section,
   wherein the refractive index of said third transparent conduction film is greater than that of said second transparent conduction film, and
   wherein the absorption coefficient of said third transparent conduction film is greater than that of said second transparent conduction film.

5. The optical device as set forth in claim 4, wherein said second transparent conduction film is thicker than each of said first and third transparent conduction films.

6. The optical device as set forth in claim 1, wherein said second transparent conduction film has a film thickness corresponding to the length of an optical path that is 0.625 or more with respect to a center wave length of light emitted from said active layer.

7. The optical device as set forth in claim 1,
wherein said second transparent conduction film is made of a dielectric mixture film in which a dielectric material is mixed with ITO or GZO.

8. The optical device as set forth in claim 7,
wherein said dielectric mixture film is a mixture of said GZO and $CaF_2$.

9. The optical device as set forth in claim 1, further comprising a second metal layer that is located between said metal layer and said transparent electrode layer and that is made of a material that is different from the material of said metal layer.

10. The optical device as set forth in claim 9,
wherein said second metal layer is made of a plurality of island shaped metal regions that are formed on said transparent conduction film side surface of said metal layer.

11. The optical device as set forth in claim 9,
wherein said second metal layer is made of any one of the metal materials from among Ni, Ti, Cr or Pd.

12. The optical device as set forth in claim 1, further comprising a polarizer located opposite to said second surface of said laminate section.

13. The optical device as set forth in claim 12, further comprising a ¼ wavelength plate located between said second surface of said laminate section and said polarizer.

* * * * *